United States Patent [19]

Merkle

[11] Patent Number: 5,357,548
[45] Date of Patent: Oct. 18, 1994

[54] REVERSIBLE CHARGE TRANSFER AND LOGIC UTILIZING THEM

[75] Inventor: Ralph C. Merkle, Sunnyvale, Calif.

[73] Assignee: Xerox Corporation, Stamford, Conn.

[21] Appl. No.: 971,782

[22] Filed: Nov. 4, 1992

[51] Int. Cl.$^5$ .............................................. G11C 19/28
[52] U.S. Cl. ........................ 377/57; 307/246; 307/607; 257/246; 257/247; 257/248; 257/249; 257/250; 257/256
[58] Field of Search ................ 257/256, 246–250; 377/57; 307/246, 607

[56] References Cited

U.S. PATENT DOCUMENTS

| | | | |
|---|---|---|---|
| 4,216,386 | 8/1980 | Boettcher | 257/246 |
| 4,697,200 | 9/1987 | Miyatake | 257/246 |
| 4,859,624 | 8/1989 | Goto | 257/250 |

OTHER PUBLICATIONS

Merkle, R. C. *Reversible Electronic Logic Using Switches*. Draft Document; Xerox Palo Alto Research Center; Nov. 3, 1992.

*Primary Examiner*—Margaret Rose Wambach

[57] ABSTRACT

Logically and thermodynamically reversible charge transfer (RCT) devices and logic are provided for conditionally transferring individually identifiable charge packets from one or more sources to one or more destinations under the control of one or more additional charge packets that indicate by their presence or absence whether the condition or conditions have been satisfied or not. The individual identities of all of these charge packets are substantially preserved while logic operations are being performed by this logic.

2 Claims, 7 Drawing Sheets

Initial State                                   Final State

| Source | Condition | Destination |     | Source | Condition | Destination |
|--------|-----------|-------------|-----|--------|-----------|-------------|
| 0      | 0         | 0           |     | 0      | 0         | 0           |
| ~~0~~  | ~~0~~     | ~~1~~       |     | ~~0~~  | ~~0~~     | ~~1~~       |
| 0      | 1         | 0           |     | 0      | 1         | 0           |
| 0      | 1         | 1           |     | 0      | 1         | 1           |
| 1      | 0         | 0           | ⟷   | 0      | 0         | 1           |
| ~~1~~  | ~~0~~     | ~~1~~       |     | ~~0~~  | ~~0~~     | ~~2~~       |
| 1      | 1         | 0           |     | 1      | 1         | 0           |
| 1      | 1         | 1           |     | 1      | 1         | 1           |

*Fig. 2*

REVERSIBLE CHARGE TRANSFER AND LOGIC UTILIZING THEM

FIELD OF THE INVENTION

This invention relates to reversible electronic logic and, more particularly, to reversible electronic logic which uses charge packets to perform logic operations.

BACKGROUND OF THE INVENTION

A. Energy Dissipation as a Limiting Factor in Logic Design

There is a body of literature on reversible computation [11] which shows that the energy dissipation per device operation (e.g., per gate operation in a computational context) cannot be reduced below In(2) kT (where k is Boltzman's constant and T is the temperature, such that kT is an approximation of the thermal energy of a single atom) if the device is not reversible.

For the last few decades the energy dissipation per gate operation has been declining with remarkable regularity [6]. Extrapolation of this trend indicates the energy dissipation per device operation might reach kT in the next couple of decades or so (assuming T is 300 Kelvins). To provide some perspective on the challenge involved in attaining that result, it may be helpful to note that an "AND" gate which has a power supply of one volt and which allows a single electron to go from that one volt supply to ground during the course of a switching operation will dissipate one electron volt. Although one electron volt is about forty times kT (and well above the theoretical limit), it clearly will be difficult for simple improvements in irreversible logic to reach an energy dissipation level as low as even one electron volt.

Furthermore, even if the energy dissipation per gate operation could be reduced to In(2) kT, a computer operating at room temperature at a frequency of 1 GHz with $10^{18}$ logic gates packed into a cubic centimeter would dissipate roughly three megawatts. Thus, it is reasonable to assume that the desire for ever greater computational power with ever more densely packed logic elements will eventually require that a single logic operation dissipate at least several orders of magnitude energy less than kT.

Heretofore, refrigeration has been employed in some computers for removing the heat they generate during operation. Refrigeration reduces the energy dissipation per gate operation, but it does not reduce the overall energy dissipation. At best, the lower energy required per gate operation is almost exactly balanced by the increased energy needed for the refrigeration.

Of course, factors other than net energy savings can make low temperature operation worthwhile in certain situations. For example, some potentially attractive devices require a refrigerated environment for proper operation. Thus, in large computers operating in stable environments (the traditional computer center, for example) refrigeration might be attractive, particularly if it permits the use of devices, such as Josephson junction devices, that provide much better performance but which require low temperature for their operation. However, even if net energy savings need not be considered, refrigeration per se is not an attractive, general purpose technique for reducing the energy dissipation per gate operation because lap top and portable computers [59], embedded systems, various "smart" appliances and other applications commonly operate in non-refrigerated environments.

B. Reversible Computation to Reduce Energy Dissipation

As is known, logic is "logically reversible" if for every defined output there is a single unique input that will generate that output. In principle, reversible logic can operate with energy dissipations indefinitely below kT per logic operation. While some unforeseen barrier is likely to be encountered eventually, the use of reversible logic appears to offer the greatest promise for continuing the current downward trend in energy dissipation per logic operation for the longest possible time.

To fully capitalize on reversible logic, "reversible" computer architectures may be needed. Such architectures have been discussed elsewhere [6, 7, 8, 11, 15, 19]. However, it is known that a wide variety of computations can be done in a reversible manner. Indeed, Bennett [15] concluded: ". . . for any e>0, ordinary multitape Turing machines using time T and space S can be simulated by reversible ones using time $O(T^{1+e})$ and space O(S log T) or in linear time and space $O(ST^e)$." This conclusion suggests that even arbitrary irreversible computations can be mapped into reversible computations.

Clearly, specific irreversible computations can often be mapped into reversible computations with little or no loss of efficiency. Thus, even in the absence of reversible computer architectures, simple applications of reversible computation can be carried out within the framework of existing computer architectures. For example, a typical computer executes a sequence of instructions, and each of these instructions typically changes the contents of a single register or memory location. Although the loading of the result of a given instruction into a register normally is irreversible because it erases the previous contents of the register, some or all of the other operations that are performed by the computer during the execution of instructions could in principle be made reversible. Therefore, while it still may be necessary in a conventionally architected computer to dissipate kT or more energy for each bit in the output register for each instruction execution, it will be evident that it is not necessary to perpetuate the current practice of using dissipative logic throughout the computer.

For example, the simple register-register add instruction R1=R1+R2 is logically reversible, so with proper hardware, such an instruction could in principle be carried out while dissipating as little energy as desired. Thus, while non-reversible instructions (e.g., R1=0) would still dissipate greater energy, the overall energy dissipation of a computer could be reduced significantly if reversible logic was employed for carrying out the reversible instructions. Of course, once the energy-wasting instructions were identified, compilers could be designed to avoid using them or at least minimize their use. This would provide an evolutionary path for migrating from the current irreversible computer architectures to computer architectures that are substantially reversible.

C. Reversible Devices

Several reversible devices have been proposed over the years. Von Neumann and Goto appear to have independently proposed the parametron [37] which encodes information in the phase of an oscillation. Fredkin and Toffoli [23]proposed an electronic reversible logic family which used switches, capacitors and inductors. By turning these switches on and off at just the right times, charge can be transferred between the capacitors through the inductors with minimal energy loss. Therefore, by increasing the size of the inductors used in these switches, it would be possible to create a family of ever slower but ever more energy efficient circuits because, as the LC time constant is increased, the energy dissipation can be decreased to an arbitrary extent.

A proposal by Likharev relating to the parametric quantron, which is based on Josephson junctions that operate at low temperatures [9, 10], has been described by Landauer [6] as being ". . . particularly significant, because it is a genuine example . . . of a system that has frictional forces proportional to velocity." It is believed that the parametric quantron would dissipate less than kT energy per operation when operating at 4 Kelvins and with a switching time of 1 nanosecond [9]. Modern "high temperature" superconductors might allow operation of such devices at relatively high temperatures, including that of liquid nitrogen [45]. However, even the modest refrigeration that would be needed to maintain such temperatures would still be a significant disadvantage.

SUMMARY OF THE INVENTION

To increase the practical feasibility of logically and thermodynamically reversible logic, this invention provides reversible charge transfer (RCT) devices and logic for conditionally transferring individually identifiable charge packets from one or more sources to one or more destinations under the control of one or more additional charge packets that indicate by their presence or absence whether the condition or conditions have been satisfied or not. The individual identities of all of these charge packets are substantially preserved while logic operations are being performed by this logic.

BRIEF DESCRIPTION OF THE DRAWINGS

Further features and advantages of this invention will become apparent when the following detailed description is read in conjunction with the attached drawings, in which:

FIG. 2 is a logical correlation table for a 3-bucket RCT;

DETAILED DESCRIPTION OF THE ILLUSTRATED EMBODIMENTS

Figure 1:
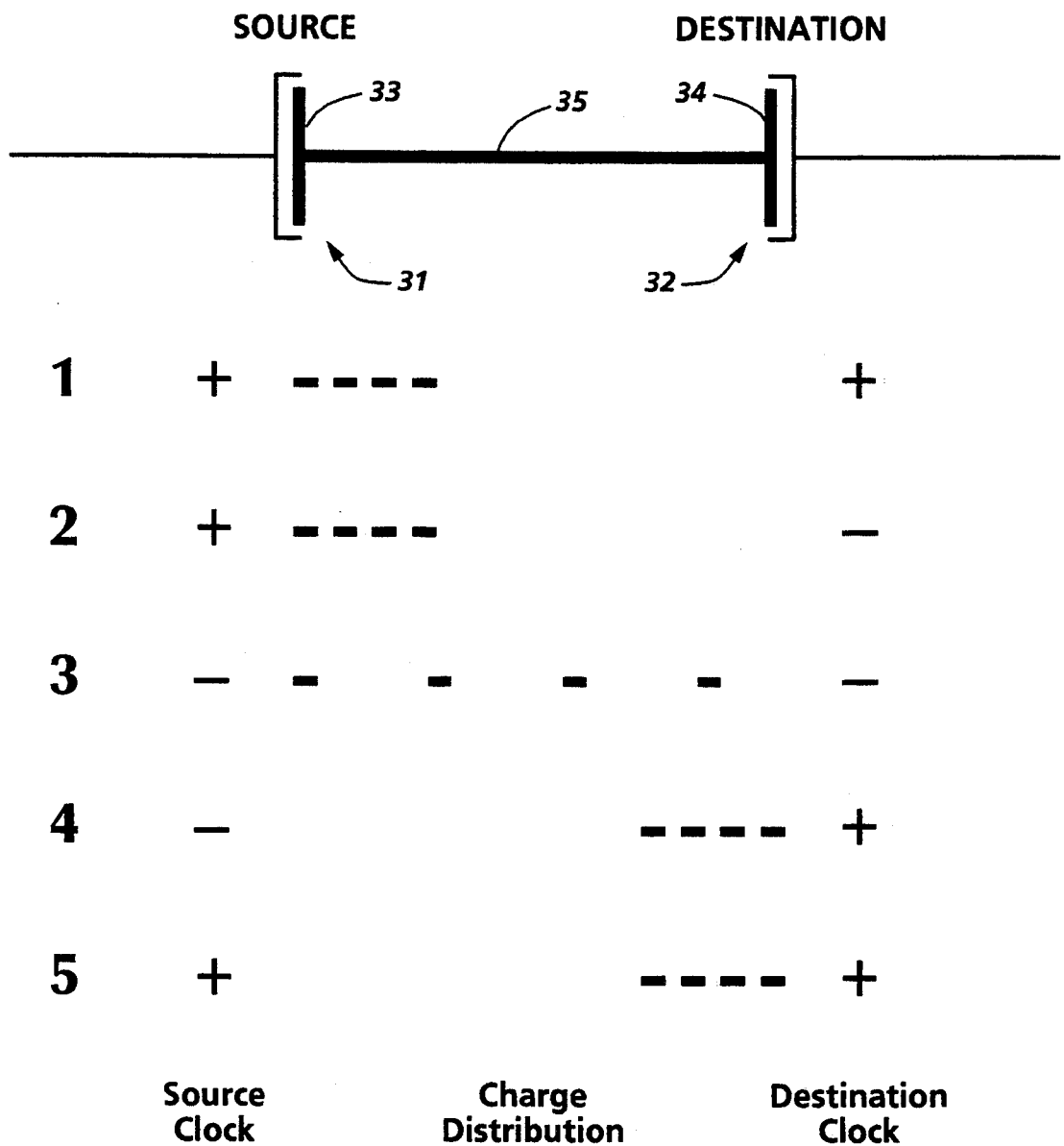
FIG. 1 is a diagram that illustrates the basic charge transfer mechanism of an RCT embodying the present invention.

While the invention is described in some detail hereinbelow with reference to certain illustrated embodiments, it is to be understood that there is no intent to limit it to those embodiments. On the contrary, the goal is to cover all modifications, alternatives and equivalents falling within the spirit and scope of the invention as defined by the appended claims.

A. Definitions and Conventions

The convention that has been adopted for defining the "on" and "off" states of the voltage controlled switches that are used to carry out this invention is:
1. When the control input to such a switch is at logic "0" (low), the switch is turned on and current can flow from the input to the output or from the output to the input.
2. When the control input is "1" (high) the switch is turned off and current cannot flow.

This convention is not the usual one. It has been adopted instead of its opposite (i.e., where a "1" turns the switch on and a "0" turns it off) because it is more intuitive when applied to the invention as described hereinbelow.

The logic devices that are provided by this invention not only are logically reversible as defined hereinabove, but also asymptotically non-dissipative in operation. They operate in an "asymptotically non-dissipative" mode because the energy they dissipate asymptotically approaches zero as their speed of operation and their manufacturing defects are reduced. Thus, these devices exhibit substantial thermodynamic reversibility.

B. An Introduction to Reversible CCD-Based Logic

In reversible CCD-based logic, 1's and 0's are represented by a packet of electrons and by the absence of a packet of electrons, respectively. The electrons are stored in potential wells or "buckets." Furthermore, each packet of electrons is treated as a unit, so packets are never split or merged. Additionally, packets are not normally created or destroyed, except when the system is initialized (which ideally occurs only once) or if and when the packets have to be refreshed (which in practice may be infrequent). While all packets preferably have approximately the same number of electrons, it is not critical that each packet have exactly the same number (e.g., it does not matter whether a particular packet has 99, 100, or 101 electrons).

The use of charge packets is most familiar in the context of CCDs (Charge Coupled Devices) [47, 50], and in the context of BBD's(Bucket Brigade Devices) [49]. In a standard CCD, charge packets typically are transferred from potential well to potential well serially along a row of devices, and the amount of charge in each packet usually is a measure of some analog quantity. Thus, CCDs are used primarily as memory elements or shift registers, but not for computation.

However, others have proposed using charge packets as the basic or primitive elements for logic operations [34, 35, 36, 46, 48]. Thus, it should be noted that the primitive logic elements upon which these prior proposals were based relate to what is sometimes called "DCCL" (Digital Charge Coupled Logic), which is highly dissipative. For example, Zimmerman et al. [34] proposed logic operations whose computation required merging packets, discarding packets by draining the charge to ground, etc. Thermodynamic reversibility was not even an objective. Similarly, Tompsett [48] proposed circuits in which the potential generated by a charge packet in a CCD potential well was coupled to the gate of an FET, thereby turning the FET on or off depending on whether a charge packet was present or absent in the potential well. The operation of the FET was used by Tompsett to create another charge packet (rather than to control the movement of an existing charge packet) for the purpose of having this new charge packet compensate for imperfect charge transfer. This proposal also demonstrated that NAND and NOR operations could be performed by applying the potential from two potential wells to two gates of two FETs that are connected in serial or parallel. Again however, thermodynamic reversibility was neither considered nor effectively achieved. Indeed, thermodynamic reversibility was unattainable because the method Tompsett employed for sensing charge in the potential well was dissipative and the sensed packets, when no longer needed, were dissipatively discarded.

To simplify the analysis of the logic provided by this invention, it will be assumed that packets never gain or lose electrons due to defects in the material or to thermal noise. This is only a minor oversimplification, because present day devices can gain or lose charge at the rate of a few parts per million [51], and such gains or losses should eventually be reduced to insignificant levels by future developments. Furthermore, even if packets are allowed to gain or lose electrons at some low rate, they could be periodically "refreshed" as required to prevent malfunction. Tompsett [48] first proposed methods of refreshing packets, but that proposal did not consider reversible methods. As will be appreciated, if a packet gains or loses an unpredictable amount of charge, "refreshing" the packet must fundamentally dissipate energy. Other than this fundamental loss, however, energy dissipation can be held to a minimum. For example, a reversible method of refreshing a packet would be to use the old packet to charge a bucket in a reversible fashion, and then to "unwrite" or discharge the bucket holding the old packet by using the new packet as the source of information. This method of refreshing a packet would, of course, dissipate energy as a function of the errors in the voltages involved. If the refresh operations were done infrequently (e.g., a packet would be refreshed only after a large number of logic operations) then the energy dissipation per logic operation from this source would be quite small. This topic is discussed in more detail in "Reversible Electronic Logic Using Switches" by Ralph C. Merkle, a paper which has been distributed in draft form, so that paper hereby is incorporated by reference.

While CCD and DCCL circuits conventionally are implemented on a semiconductor surface using planar technology, this geometrical constraint is not fundamental.

C. Transferring Charge With Little Dissipation

Before discussing the more complex operations that are needed for computation, it will be helpful to focus on FIG. 1 to briefly consider a timed sequence of steps that transfers charge from a "source bucket" 31 to a "destination bucket" 32 with as little energy loss as desired. As shown, the two buckets 31 and 32 have semiconductor plates 33 and 34, respectively, that are joined by a semiconductor path or channel 35. This is important because the use of metallic plates or a metallic connection between the plates 33 and 34 would cause unwanted energy dissipation.

Initially, as illustrated by state 1, both the source clock and destination clock are + (positive), and the charge packet resides entirely within the source bucket. The clocking sequence then shifts the charge from the source bucket 31 to the destination bucket 32 in a series of steps 2–5, where each step can dissipate an arbitrarily small amount of energy. More particularly, during the transition from state 1 to state 2, the destination clock is driven negative (−). This results in negligible energy dissipation, because no charge can move at this time since the source clock is still at a positive voltage level and the destination bucket is still essentially empty. Next, while advancing from state 2 to state 3, the source clock is also driven negative, thereby producing a repulsive field that causes the charge carriers (i.e., electrons in this example) in the charge packet to move out of the source bucket 31. However, during state 3 of the process, the destination clock also is negative, so the electrons migrate smoothly out of the source bucket 31. This is important because, if the destination clock were positive instead of negative during stage 3, the electrons would move out of the source bucket 31 and then "fall down hill" into the destination bucket 32, thereby dissipating energy. Subsequently, while transitioning from state 3 to state 4, the destination clock changes from negative to positive, so it slowly attracts the electrons and gathers them into the destination bucket 32. Finally, as the process advances from state 4 to state 5, the source clock changes from negative to positive. That restores the system to its original condition, but with the charge packet now in the destination bucket 32 instead of the source bucket 31.

The primary sources of energy dissipation in the process depicted in FIG. 1 are associated with the transitions from state 2 to state 3, and from state 3 to state 4. These transitions involve charge migration, so they cause some unavoidable dissipative losses. However, as the clock frequency is reduced, the rate of change of the clock voltages can be reduced, thereby slowing the movement of the charges, and hence reducing the energy dissipation. Because energy dissipation is a function of the square of the current, reducing the frequency of operation by a factor of two reduces the current by a factor of two which, in turn, reduces the energy dissipation by a factor of four. This means that the energy dissipated per logic operation is reduced by a factor of two. Even more generally, the foregoing analysis demonstrates that the energy dissipated per logic operation can be reduced to any desired level by reducing the clock frequency.

D. A Primitive Model for Reversible Computations

Turning now to the somewhat more complex subject of reversible computation, it will be seen that such computations can be carried out by implementing the following primitive operation:

Transfer charge out of a source bucket and into an empty destination bucket if a "condition" bucket holds a "0", but do not transfer the charge if the condition bucket holds a "1"

"Empty" in this context means "has essentially no charge carriers present." That is, an "empty" bucket is in logic state "0." Of course, if the condition bucket is in logic state "1", the destination bucket need not be empty because no charge transfer occurs. In other words, the charge in the condition bucket is used to control the transfer of charge along the path between the source and destination buckets.

As described hereinbelow, this primitive operation can be implemented by a 3-bucket Reversible Charge Transfer device (a basic "RCT"). This RCT is a reversible DCCL device. Logically, the RCT is related to, but materially different from, a Fredkin et al. switch gate [7, page 241] that is implemented using charge packets instead of colliding billiard balls. While the operation of the RCT will be described with reference to the above-defined primitive operation, it will be evident that a wide variety of logic functions could be carried out by employing the reversible transfer of charge from one bucket to another.

During normal operation, RCT devices (1) never merge or split charge packets (2) never discharge charge packets to ground, and (3) move charge packets in a more or less thermodynamically reversible fashion from a set of source buckets to a set of destination buckets, conditional on the presence or absence of charge in a set of condition buckets. As used herein, thermodynamic reversibility means that energy dissipation per device operation, in the absence of manufacturing defects, could be made much smaller than kT simply by slowing the speed of operation at least for some practical temperatures, T. RCT devices are conservative logic devices because the number of charge packets is conserved (in other words, the number of 1's is conserved during the computation, which means that the number of 1's at the input is the same as the number of 1's at the output). The 3-bucket RCT is the simplest RCT because it has only one condition bucket, only one source bucket, and only one destination bucket. More complex RCT's have more buckets, so the pattern of charge transfer is more complex in them. Indeed, to illustrate the flexibility of the reversible logic of this invention a few of these more complex RCT's will be briefly described hereinbelow.

The operation of a 3-bucket RCT can be described in the C programming language as:

if (Condition==0) {Destination=Source;
    Source=0};

The precondition that must be true prior to executing this RCT model is:

(Destination==0) OR (Condition==1)

Violation of this essential precondition would result in an unwanted dissipative step. It will become apparent, however, that this precondition does not cause the RCT primitive to be data dependent. Specifically, it will be shown that provision can be made in a well-designed RCT circuit to insure that the precondition is satisfied, without knowing what values are presented as inputs to the circuit.

To more precisely define the logical operation of an RCT, FIG. 2 logically correlates the possible initial and final states of such a device. The legal initial states of the RCT on the left of this table correlate with the final states shown on the right, but this correlation exists only after the sequence of clock signals that cause the RCT to step through a complete operating cycle. As will be seen, there is only one legal, non-trivial change of state; viz., when the source is 1, the condition is 0, and the destination is 0. In all other cases either the input and output states are the same or the input state is illegal. The illegal states are struck out in FIG. 2 because they would produce undesired energy dissipation.

E. Implementing a Fredkin Gate with an RCT

Figure 3:
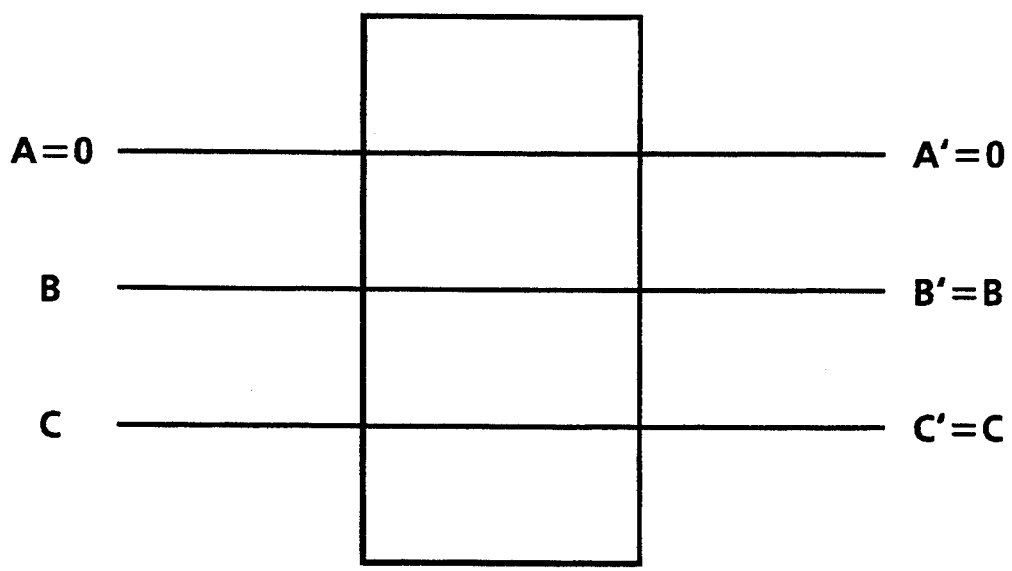
FIGS. 3 and 4 illustrate alternative logical states of a Fredkin gate.
Figure 4:
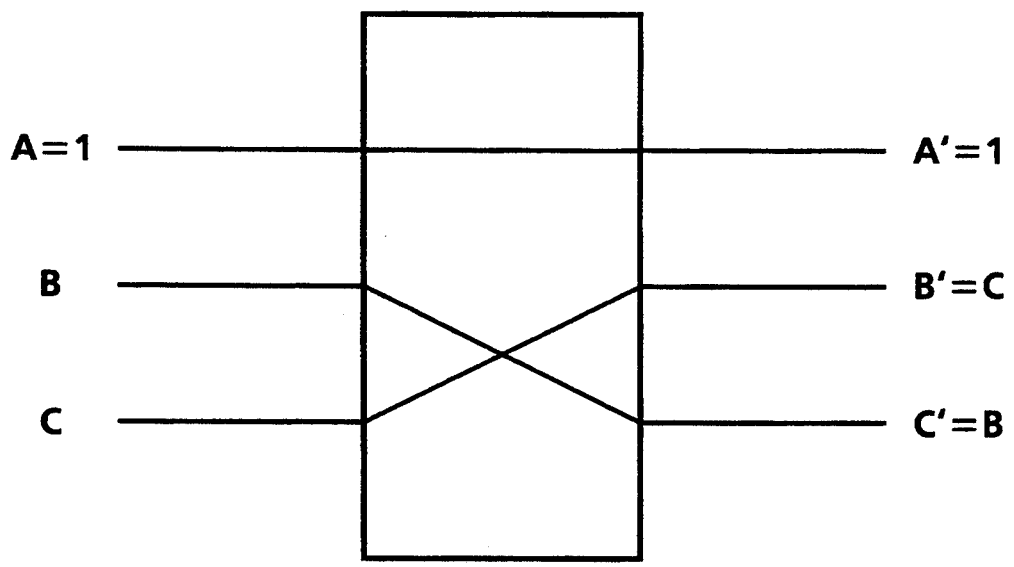

An RCT is logically complete, so it can be employed for implementing a Fredkin gate. As shown in FIGS. 3 and 4, a Fredkin gate [7] has three inputs and three outputs. The inputs are the control input A, and two signal inputs B and C. The outputs, in turn, are identified as A', B', and C'. In operation, if the control input A is 0, then A'=A, B'=B, and C'=C (see FIG. 3). If, on the other hand, the control input A is 1, then A'=A, B'=C, and C'=B (see FIG. 4). This means that the output of the Fredkin gate is identical to the input if A=0, but B' and C' are exchanged if A=1.

The following sequence of RCT operations effectively implement a Fredkin gate:

0.) Given that: A, B, and C hold arbitrary input values; InitiallyOne is set to a logic "1" to indicate the presence of an electron packet; and all other variables are initialized to logical "0" (i.e., to indicate the absence of an electron packet). Then:

1.) If A is 0, then C'=C.
2.) If A is 0, then B'=B.
3.) If A is 0, then NotA=InitiallyOne.
4.) If NotA is 0, then C'=B.
5.) If NotA is 0, then B'=C.
6.) If AlwaysZero is 0, then A'=A.
7.) If A' is 0, then InitiallyOne=NotA.

As will be seen, steps 1 and 2 of the foregoing sequence simply transfer charge from B and C into B' and C', respectively, if A is 0. B' and C' are initially empty, so this transfer satisfies the above-defined RCT preconditions. Step 3, in turn, computes the logical negation of A and leaves that logical negation in "NotA." Steps 4 and 5 next transfer charge from B and C into C' and B', respectively, to thereby exchange the outputs. However, this occurs only if the above-defined precondition is satisfied, because if A is 0, then Nora will be 1 and the transfer will not take place (if the transfer does not take place, the prior contents of B' and C' are irrelevant). On the other hand, if A is 1, then NotA will be 0, so the transfer will take place. In this case, however, B' and C' will be empty (have logic values 0) as a result of their initialization, so the transfer will take place correctly. In any event, step 6 subsequently copies A into A' unconditionally. Step 7 then restores the value of InitiallyOne if it was altered during the computation.

The above outlined implementation of a Fredkin gate takes three arbitrary input values and, after a sequence of RCT operations, produces three output values. This means that N Fredkin gates could be combined to accept 3N input values and produce 3N output values at the same time.

In the RCT implementation of a Fredkin gate, all output values are initialized to a 0 logic state. However, after completing the sequence of clocking operations for a complete operating cycle, the inputs are all 0 and the outputs hold arbitrary values. Thus, the "input" and "output" definitions can be logically exchanged (e.g., no physical operation takes place because this merely involves relabeling the "input" variables as "output," and the "output" variables as "input"). This logical exchange establishes the appropriate preconditions for the next sequence of operations because the (just relabeled) inputs again hold arbitrary logic values, while the (just relabeled) outputs hold logic 0's. Accordingly, a different set of clock lines can now be driven to cause this relabeled Fredkin gate to generate the next "state" of the computation. In effect, this is a "ping-pong" or "double buffer" scheme for computing successive values of the global state of the system. More particularly if the two sets of variables are named A and B, and it the two logic functions for the "next state" of the system are named F and G, then it will be evident that the first cycle first computes B=F(A). B is initially all zeroes, while A holds arbitrary logic values, but on completion of the computation of F, A is all zeroes while B holds arbitrary logic values, so A=G(B) then can be computed. Because G uses B as its input and A as its output, the condition that the outputs be all zeroes is met during the computation of G. This returns the system to the state where A holds arbitrary logic values and B holds all zeroes, so it will be apparent that this computational process can be repeated indefinitely.

F. Implementation of a 3-Bucket RCT

Figure 5:
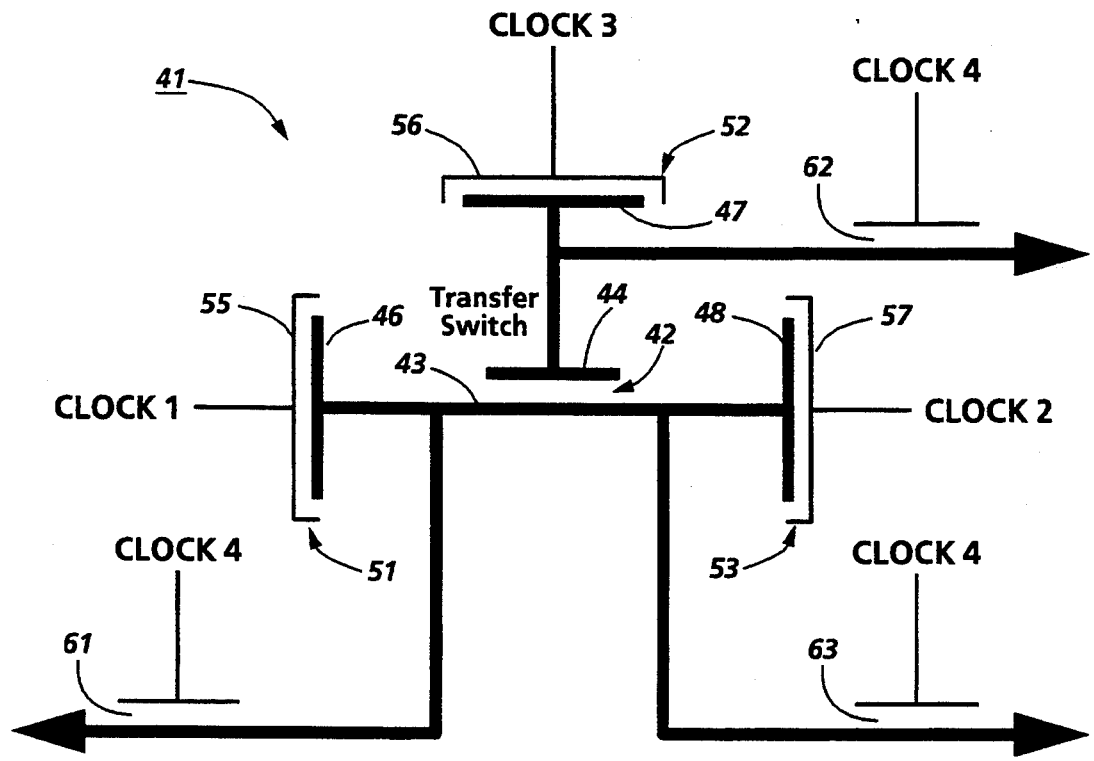
FIG. 5 is a schematic diagram of a 3-bucket RCT.

A planar embodiment of a 3-bucket RCT 41 is shown in FIG. 5. This particular embodiment could be implemented, for example, through the use of existing, Silicon-On-Insulator technology, although it is to be noted that the field effect transistor (FET) that is used as the transfer switch 42 would be "tilted on its side" in such an implementation. The source/destination path or channel 43 of the RCT 41, and the gate 44 of its transfer switch 42 are defined by suitably patterned semiconductors. Furthermore the inner plates 46, 47 and 48 of the source bucket 51, the control bucket 52 and the destination bucket 53, respectively, also are semiconductors. That is important because the use of metal for these components would cause unwanted energy dissipation.

As illustrated, the RCT 41 is a combination of three CCD potential wells or "buckets" 51, 52 and 53 and an FET 42. In operation, a charge packet is first transferred from the "condition" potential well 52 to the gate of the FET 42. The charge packet in the "source" potential well 51 is then moved to the source of the FET 42 from where it conditionally migrates (i.e., the charge on the gate of the FET 42 permitting) through the channel 43 and out the drain of the FET 42 into the "destination" potential well 53.

Figure 6:
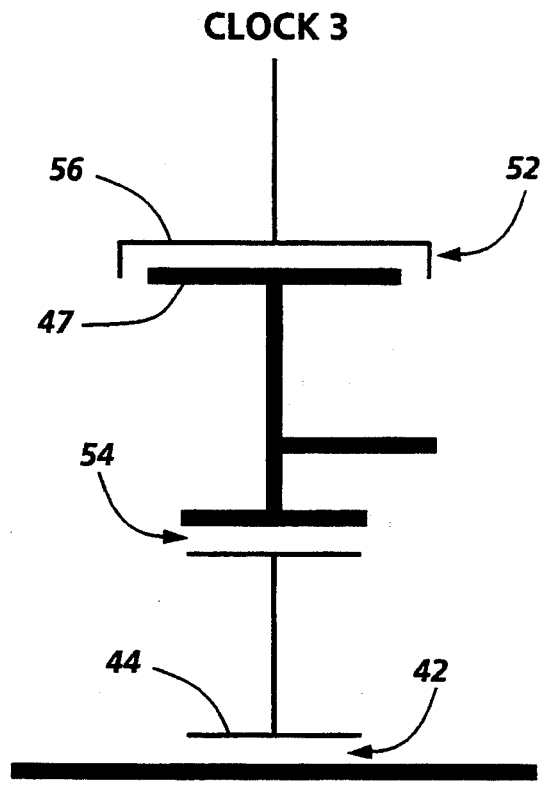
FIG. 6 is a fragmentary diagram that illustrates an alternative implementation of the transfer gate for the 3-bucket RCT shown in FIG. 5.
Figure 6:
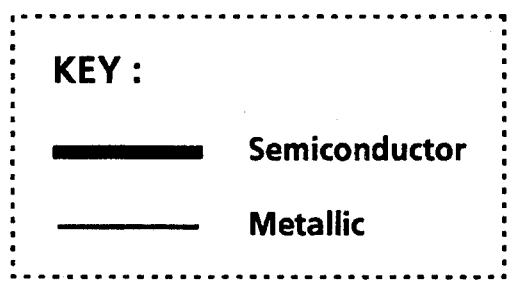

There are some similarities between the RCT 41 and the device Tompsett [48] proposed for sensing the presence or absence of a charge in a CCD potential well. However, the Tompsett device has a metalization that is used as the gate electrode of an FET. As a result of this metalization, the charge injection from the gate into the doped region that connects to the potential well of the Tompsett device, while small if the capacitance of the gate is small, still introduces an unwanted source of energy dissipation. There are still other aspects of the devices Tompsett proposed that are irreversible or highly dissipative, but there is no need to describe them in detail herein. Rather, it will suffice to note that in the RCT 41, both the gate 44 of the FET 42 and the path 54 between the condition bucket 52 and the gate 42 are semiconductors. Thus, the vast majority (if not the only) charge carriers in this semiconductor path would be those that are deliberately introduced as a charge packet. As shown in FIG. 6, a similar result can be achieved while utilizing a metallic gate for the FET 42, but it is necessary to capacitively couple the condition bucket 52 to the gate of the FET 42. In this embodiment, one plate of the coupling capacitor 54 (the plate connected to the gate of the FET 42) can also be metallic, but the other plate capacitor 54 and its connection to the condition bucket 52 are semiconductors. Thus, potential can be applied to the gate of the FET 42 via the coupling capacitor 54, but charge carriers are inhibited from moving into or out of the semiconductive components, so charge injection from the gate electrode would still be substantially precluded.

A step-by-step description of a full operating cycle of the RCT 41 will demonstrate how reversible logic operations are performed by these devices. Initially, during step 0 of the cycle, a charge of unknown value is present in the source bucket 51, and the destination bucket 53 is either empty (if the condition bucket 52 holds a 0) or contains an unknown charge (if the condition bucket 52 holds a 1). Essentially all charge carriers (electrons) are located in the potential wells 51, 52 and 53 at this time because Clock 1, 2 and 3 are applying a positive (+) voltages to their outer plates 55, 56 and 57, respectively. In other words, these positive clock voltages initially maintain net positive charges on the buckets 51, 52 and 53 respectively, thereby creating potential wells for holding the electrons and preventing them from migrating away. As a result, the channel region 43 of the switch 42 is essentially fully depleted of charge carriers. Furthermore, clock 4 is driven negative with a large voltage, thereby cutting off FET switches 61, 62 and 63 isolate the source bucket 51, the condition bucket 52 and the destination bucket 53 of the RCT 41 from the external circuitry (not shown) that apply packets to and receive packets from the RCT 41 during other phases of the data processing cycle. As will be evident, additional switches (also not shown) controlled by clock 4 might be required to further isolate the buckets 51-53 of the RCT 41 in a larger circuit, but they are not needed for this simplified example.

Following the initialization and isolation of the RCT 41 (i.e., step 0), clock 3 is driven negative during step I of the computational cycle, thereby producing a repulsive field for conditionally forcing charge from the condition bucket 52 onto the gate of the transfer switch 42. That is, if charge is present in the condition bucket 52, that charge will be transferred to the gate of the transfer switch 42 when clock 3 goes negative, thereby cutting off the transfer switch 42. The voltage that is required to cut-off the transfer switch 42 is only a fraction of the voltage that is provided for the high voltage cut-off clock (clock 4).

To carry out step 2 of the computational cycle, clock 2 is driven negative. If there happens to be a charge on the destination bucket 53 when this occurs, that charge will not be materially affected because the transfer switch 42 is would in this case be cutoff. On the other hand, if there is no charge on the destination bucket 53, the state of the transfer switch 42 is immaterial because no charge transfer can take place as yet.

During step 3 of the computational cycle, clock 1 is driven negative. If the transfer switch 42 is turned off when this occurs, no charge will be transferred. If, on the other hand, the transfer switch 42 is turned on, charge will move gradually through the transfer switch 42 into the destination bucket 53. Because clock 2 now also is negative, charge will not "fall down hill" in a dissipative fashion when moving into the destination bucket 53. Clock 1 is selected to be a relatively small magnitude signal, so a relatively small negative voltage is generated during the charge transfer process. Consequently, the intermediate voltage on the gate of the transfer switch 42 is sufficient to block charge transfer if charge transfer is not supposed to take place. This insures that charge will be reversibly transferred from the source bucket 51 to the destination bucket 53 only if the condition bucket 52 held a logical "0" when the cycle began.

Next, to perform step 4 of the computational cycle, clock 2 is gradually driven positive, thereby allowing charge to flow smoothly into the destination bucket 53. When clock 2 reaches its full positive potential, substantially all the charge is held on the destination bucket 53 and essentially no charge carriers are present in either the source bucket 51 or in the channel region of the transfer switch 42, even if the transfer switch 42 was turned on.

To advance to step 5 of the computational cycle, clock 1 is driven positive. This has no effect if a charge packet has been transferred from the source bucket 51 to the destination bucket 53, but it causes the charge to return to its original state if no transfer occurred. Similarly, clock 3 is driven positive, allowing the charge on the transfer gate to return to the condition bucket.

The cycle then is completed by step 6 during which clock 4 is returned to 0, thereby turning on the isolation switches 61–63 to reconnect the RCT 41 to the external circuitry (not shown).

G. Energy Loss

Some power is dissipated during the computational cycle of the RCT 41 because current flows through a resistive medium. The power lost will be PowerLoss=$I^2R$, where I is the current and R the resistance. The current is proportional to the frequency of operation of the RCT 41, so if the operating frequency is low the current will also be low. This means that the power losses from resistive losses will fall off with the square of the frequency such that $$\text{PowerLoss} \propto f^2 \quad (1)$$

Because the number of operations per second is also lower at a lower frequency, the actual energy loss per logic operation is proportional to the frequency of operation:

$$\text{EnergyLoss} \propto f \quad (2)$$

Hence, by reducing the frequency of operation, the energy loss per operation can be reduced to whatever extent is desired. Of course, the concept of "low frequency" operation is relative. For example, CCD's with a 0.9997 charge transfer efficiency operating at 1 GHz have been demonstrated [54].

A classical quantum-level analysis builds on the observation that the electron drift velocity $V_d$ equals the electric field E times the mobility $\mu$:

$$V_d = E\mu \quad (3)$$

Thus, if d is the distance traveled by an electron as it moves from one bucket to the next, and if t is the time of a single logic operation, then a reasonable first order approximation is:

$$d = V_d t \quad (4)$$

The total energy dissipated by the movement of n electrons as they move from the source to the destination is simply the product of the force, the distance and the number of electrons, or:

$$E_{dissipated} = neEd \quad (5)$$

where $E_{dissipated}$ is the energy dissipated, n is the number of electrons in a packet, and e is the charge of an electron.

Thus, by substituting equations (3) and (4) into equation (5), it can be shown that the following approximation applies:

$$E_{dissipated} = \frac{ned^2}{\mu t} \quad (6)$$

Taking this classical analysis even further, it can be shown that the energy dissipated per logic operation is approximately $10^{-21}$ joules if the following assumptions are made: the distance traveled by the charge packet as it moves from one bucket to the next is 0.1 microns ($10^{-5}$ centimeters); one packet contains 100 electrons; the mobility is 1800 cm$^2$/V-s (the approximate mobility of diamond or silicon near room temperature); the time allotted for one logic operation is 1 nanosecond; and the charge e on an electron is $1.6 \times 10^{-19}$ coulombs. However, this estimate is based on a classical model and involves some significant simplifications. Most significantly, the mean free path will of necessity be less than 0.1 micron in a device whose maximum dimension is 0.1 micron, which implies that the meaning of the electron mobility $\mu$ is somewhat obscured for such sub-micron size devices. Thus, it will be evident that more detailed quantum analysis is essential as the size becomes smaller [44]. Such an analysis might suitably be based on the observation that the resistance of the channel of a sufficiently small FET (e.g., one in which the channel width is perhaps a few nanometers and only a single transmission mode exists) is roughly $h/2e^2$, where h is Planck's constant. This is a fundamental unit of resistance of about 26K$\Omega$. A packet of n electrons flowing in time t produces a current of ne/t. The power produced by such a current flow is $I^2R$, while the energy dissipation per logic operation is $I^2R \times t$, or $(ne/t)^2 \times h/(2e^2) \times t$ which simplifies to:

$$E_{dissipated} = \frac{hn^2}{2t} \quad (7)$$

For a switching time t of 1 nanosecond and a packet size n of 100 electrons, this is $3 \times 10^{-21}$ joules for each packet that is passed through the channel of the FET. Under the specific conditions considered here this second approximation agrees at least in order of magnitude with the estimate based on a classical model.

But, on a somewhat more detailed level, it is interesting to note that equations (6) and (7) have significant differences. The resistance of the channel in the classical case varies with the length of the channel. The length of the channel is less significant in the nonclassical case. The size of the charge packet, n, also influences energy dissipation in different ways in the two cases. In the classical case of equation (6), the energy dissipation is a function of n rather than $n^2$ as in equation (7). Thus, in the classical case, two electrons drifting under the influence of the same electric field in separate regions of the channel will dissipate twice as much energy as a single electron. In effect, the resistance has been halved because the number of charge carriers has been doubled. A similar effect would occur in a doped semiconductor if the doping density was doubled. If, however, it is assumed that the channel is so narrow that it supports a single transmission mode, then doubling the size of the charge packet will cause more electrons to move through the same channel in the same time period, with a resulting increase in the interactions among the electrons.

It is to be understood that equations (6) and (7) are rough approximations that apply only under a limited range of conditions. They are not intended to express universal truths, but are included only to illustrate the direction in which the technology may be moving and to identify some of the issues that need to be addressed. For example, mobility, p, can be substantially increased by reducing the temperature. Mobilities greater than 1,000,000 have been demonstrated in GaAs-AlGaAs HFET's at around 10 K [1, page 298]. While the impact of this is unclear when the device size is much smaller than the mean free path (which occurs with such high mobilities), it clearly means that larger devices could be made which would have very low energy dissipation.

H. Other RCT's

Figure 7:
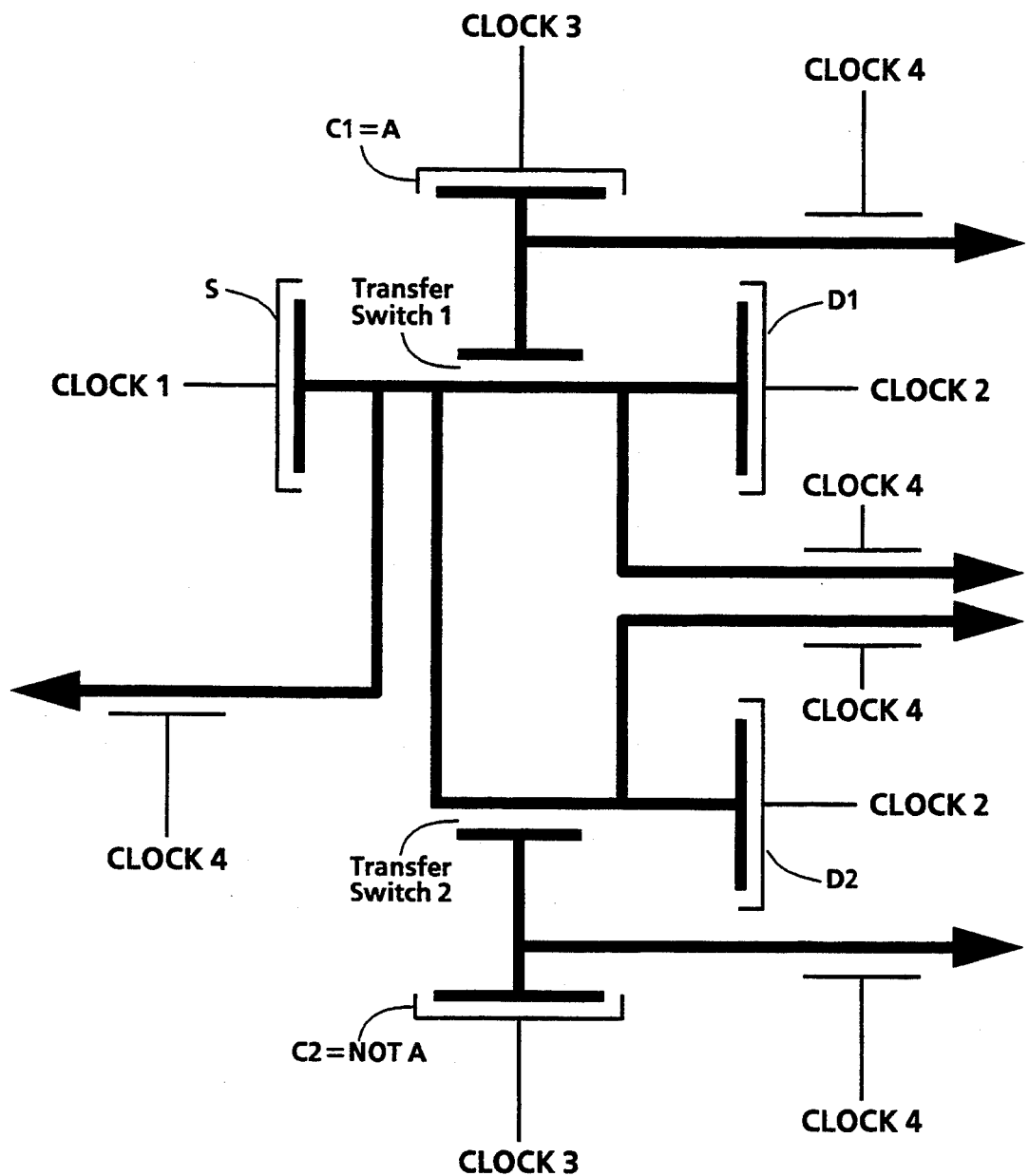
FIG. 7 is a schematic diagram of a 5-bucket RCT.

More complex RCT's can be provided to perform more complex logical operations. For example, as shown in FIG. 7, there is an RCT that has two condition buckets C1 and C2 for complimentary charge packets ("A" and "NotA", respectively), a single source bucket 5 and two destination buckets D1 and D2. Such a 5-bucket RCT would be suitable for implementing the primitive: "transfer charge from S to D1 if A is false, or from S to D2 if A is true." As before, an appropriate pre-condition would effectively prevent the merging of two packets. Such a 5-bucket RCT is logically complete and has certain implementation advantages. In particular, because both A and its complement, Not A, are available, the charge in the source bucket need only be "steered" to the appropriate destination bucket D1 or D2. In other words, there would be no need to inhibit transfer of charge from the source bucket as is required by the "no transfer" state of 3-bucket RCT This means that the control voltage that is required by the 5-bucket RCT to prevent the charge from moving into the wrong destination bucket is smaller than the voltage that is required in the 3-bucket RCT to prevent the charge from transferring to its single destination bucket when the conditions for such a charge transfer are not satisfied.

Figure 8:
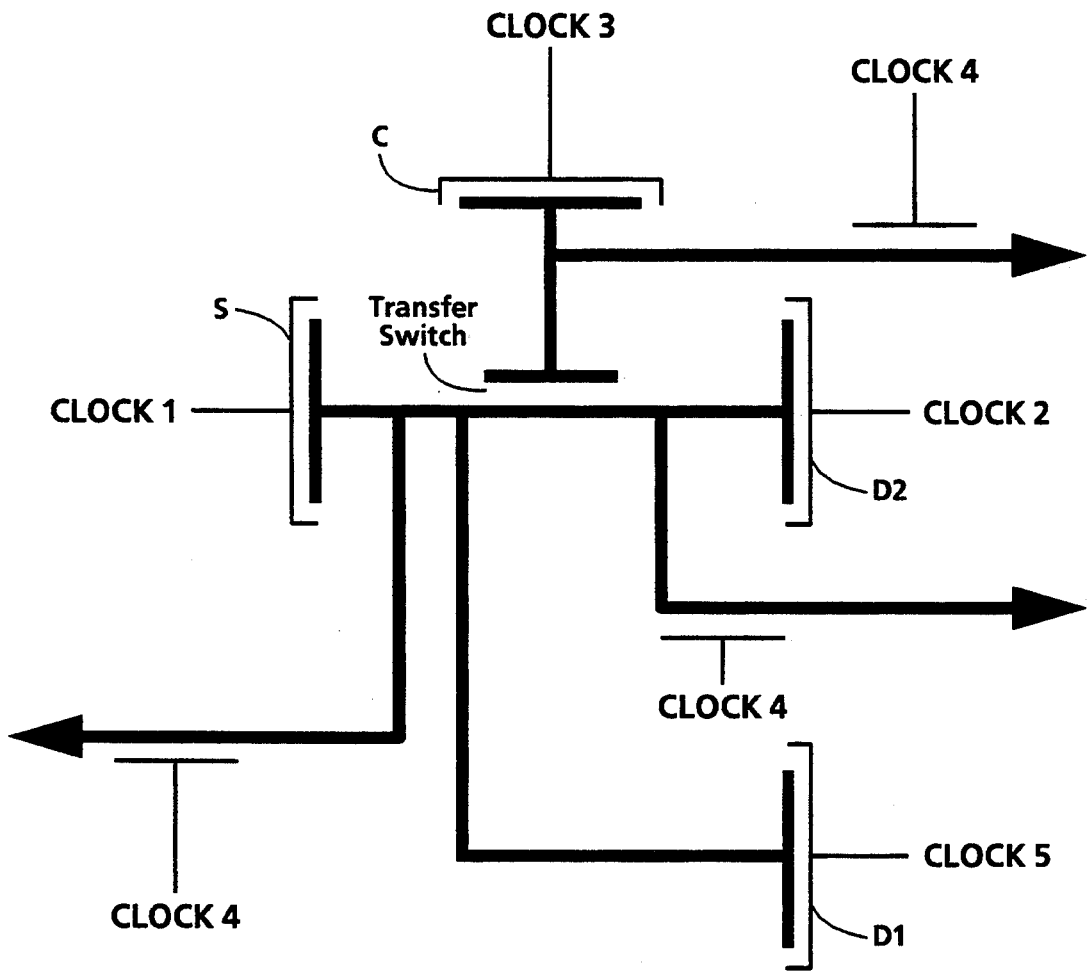
FIG. 8 is a schematic diagram of a 4-bucket RCT.

Referring to FIG. 8, the same logic function (i.e., transfer charge from S to D1 if A is true, or from S to D2 if A is false) could also be implemented in a somewhat different fashion by using a 4-bucket RCT with a single source bucket S, a single condition bucket C and two destination buckets D1 and D2. In this alternative implementation, the charge in C (i.e., A) would control a single FET between S and D2, while S and D1 would always be connected. Thus, the key to the conditional transfer in this embodiment is the timing of the clock lines for the two destination buckets D1 and D2. In particular, the FET would first be conditionally enabled for transferring the charge from the source buckets to the destination bucket D2 if A is false (i.e., if the condition bucket C is "empty"). During this phase of the process, D1 would be maintained in an unreceptive state (the clock for D1 would be negative). Thereafter, however, the clock for D1 would be driven positive, thereby causing the charge packet in S to transfer to D1 only if that packet had not previously been transferred to D2 through the transfer FET. Therefore, charge would be moved conditionally to either D1 or D2 depending on the condition C. In some sense, this is logically equivalent to the operation of a 3-bucket RCT that is followed by external circuitry for unconditionally transferring any charge remaining in S at the conclusion of a computational cycle to a second destination bucket D2.

Furthermore, it now will be evident that a 4-bucket RCT with a single source bucket S, a single destination bucket D and two condition buckets C1 and C2 (not shown) could be configured to transfer charge from S to D only if both C1 and C2 were at logic 0. Indeed, it now will be apparent that there are a great many possible variations on this theme because more or less arbitrary switching functions can be used for conditionally steering charge packets from the source buckets to the destination buckets, and the number of condition buckets can be increased as required to provide the desire control.

CONCLUSION

In view of the foregoing it will now be seen that this invention provides logically and thermodynamically reversible charge transfer devices and logic for conditionally transferring individually identifiable charge packets from one or more sources to one or more destinations under the control of one or more additional charge packets that indicate by their presence or absence whether the condition or conditions have been satisfied or not. Furthermore, it will be understood that the individual identities of all of these charge packets are substantially preserved while logic operations are being performed by this logic. For additional detail, reference is hereby made to a paper by Ralph C. Merkle on "Reversible Electronic Logic Using Switches," which hereby is incorporated by reference.

BIBLIOGRAPHY

1.) High-Speed Semiconductor Devices, by S. M. Sze, Wiley Interscience 1990.
2.) Rod Logic and Thermal Noise in the Mechanical Nanocomputer, by K. Eric Drexler, in Proceedings of the 3rd International Symposium on Molecular Electronic Devices, F. L. Carter, R. E. Siatkowski, H. Wohltjen, eds., NorthHolland 1988.
3.) The Fundamental Physical Limits of Computation, by Charles H. Bennett and Roll Landauer, Scientific American, July 1985, pages 48–56.
4.) Single Electronics, by Konstantin K. Likharev and Tord Claeson, Scientific American Vol 266 No. 6, June 1992, pages 80–85.
5.) The Fundamentals of Physics, Extended Third Edition, by David Halliday and Robert Resnick, Wiley 1988.
6.) Dissipation and noise immunity in computation and communication, by Roll Landauer, Nature, Vol. 335, Oct. 27 1988, page 779.
7.) Conservative Logic, by Edward Fredkin and Tommaso Toffoli, International Journal of Theoretical Physics, Vol. 21, Nos. 3/4, 1982, pages 219–253.
8.) The Thermodynamics of Computation—A Review, by Charles H. Bennett, International Journal of Theoretical Physics, Vol. 21, No. 12, 1982, pages 905–940.
9.) Classical and Quantum Limitations on Energy Consumption in Computation, by K. K. Likharev, International Journal of Theoretical Physics, Vol. 21, Nos 3/4, 1982, pages 311 to 326.
10.) Reversible Conveyer Computation in Array of Parametric Quantrons, by K. K. Likharev, S. V. Rylov, and M. K. Seinenov, IEEE Transactions on Magnetics, Vol. MAG-21, No. 2, March 1985, pages 947–950.

11.) Notes on the History of Reversible Computation, by Charles H. Bennett, IBM J. Research and Development, Vol. 32, No. 1, January 1988, pages 16–23.

12.) Engines of Creation, by K. Eric Drexler, Doubleday, 1986.

13.) There's Plenty of Room at the Bottom, a talk by Richard Feynman (awarded the Nobel Prize in Physics in 1965) at an annual meeting of the American Physical Society given on Dec. 29, 1959. Reprinted in "Miniaturization", edited by H. D. Gilbert (Reinhold, New York, 1961) pages 282–296.

14.) A Small Revolution Gets Under Way, by Robert Pool, Science, Jan. 5, 1990.

15.) Time/Space Trade-offs for Reversible Computation, by Charles H. Bennett, SIAM J. Computing, Vol. 18, No. 4, pages 766–776, August 1989.

16.) Two Types Of Mechanical Reversible Logic, by Ralph C. Merkle, submitted to Nanotechnology.

18.) Nanosystems: Molecular Machinery, Manufacturing, and Computation, by K. Eric Drexler, John Wiley, 1992.

19.) The Design of a Conservative Logic Computer and a Graphical Editor Simulator, by Andrew Lewis Ressler, Master's Thesis, Department of Electrical Engineering and Computer Science, Massachusetts Institute of Technology, January 1981.

20.) Donor Impurities, N-type Doping, and Impurity Diffusion in Diamond, by J. Bernholc, S. A. Kajihara, and A. Antonelli, 20th International Conference on Semiconductors, Volume 1, page 332–335.

21.) An Electroid Switching Model for Reversible Computer Architectures, by J. Storrs Hall, Laboratory for Computer Science Research, Rutgers University; presented at the Physics of Computation Workshop, Dallas Texas, Oct. 2–4, 1992.

22.) Quantum photoyield of diamond (111)—A Stable negative-affinity emitter, by F. J. Himpsel, J. A. Knapp, J. A. Van Vechten, and D. E. Eastman, Phys. Rev. B, Vol. 20 No. 2, pages 624–627.

23.) Design Principles for Achieving High-Performance Submicron Digital Technologies, by Edward Fredkin and Tommaso Toffoli, November 1978 DARPA proposal.

24.) Magnetic Bubbles, by Andrew H. Bobeck and H. E. D. Scovil, Scientific American, June 1971, Vol. 224, No. 6, pages 78–91.

25.) Ideal MOS Curves for Silicon, by A. Goetzberger, Bell Systems Technical Journal, Vol 45, September 1966, pages 1097–1122

26.) Single atoms as transistors, by Sean Washburn, Nature Vol 357, May 21, 1992, pages 199–200.

27.) A CCD/CMOS process for integrated image acquistion and early vision signal processing, by Craig L. Keast and Charles G. Sodini, SPIE Vol. 1242 Charge-Coupled Devices and Solid State Optical Sensors (1990), pages 152–161.

28.) Eliminating Threshold Losses in MOS Circuits by Bootstrapping Using Varactor Coupling, by Reuben E Joynson, Joseph L. Mundy, and Constantine Neugebauer, IEEE Journal of Solid-State Circuits, Vol SC-7, No. 3, June 1972, pages 217–224.

29.) Hot-Clock nMOS, by Charles L. Seitz, Alexander H. Frey, Sven Mattisson, Steve D. Rabin, Don A. Speck, Jan L. A. van de Sneepscheut, 1985 Chapel Hill Conference on VLSI, Computer Science Press, pages 1–17.

30.) Semiconductor Surface Varactor by R. Lindner, The Bell System Technical Journal, Vol. 41 No. 3, May 1962, pages 803–831.

31.) Energy-Time Trade-Offs in VLSI Computations, by Akhilesh Tyagi, pages 301–311; in Lecture Notes in Computer Science, 1989, Volume 405: Foundations of Software Technology and Theoretical Computer Science, Ninth Conference, Bangalore India, edited by C. E. Veni Madhaven, December 1989.

32.) A Proof about Molecular Bearings, by Ralph C. Merkle, submitted to Nanotechnology.

33.) Private communication, K. Eric Drexler.

34.) Digital Charge-Coupled Logic (DCCL), by T. A. Zimmerman, R. A. Allen, and Robert W. Jacobs, IEEE Journal of Solid State-Circuits, Vol. SC-12, No. 5, October 1977, pages 473–485.

35.) Combinatorial Digital Logic Using Charge-Coupled Devices, by J. Greg Nash, Journal of Solid-State Circuits, Vol SC-17, No. 5, October 1982, pages 957–963.

36.) Basic C.C.D. Logic Gates, by J. H. Montgomery and H. S. Gamble, The Radio and Electronic Engineer, Vol. 50, No. 5., pages 258–268, May 1980.

37.) A New Concept in Computing, by R. L Wigington, Proceedings of the IRE, April 1959, Vol 47, No 4, page 516–523.

44.) Approaching the Quantum Limit, by Karl Hess and Gerald J. lafrate, IEEE Spectrum, Vol. 29 No. 7, July 1992, pages 44–49.

45.) Natural Josephson Junctions, by Colin Pegrum, Nature, Vol. 358, July 16, 1992, page 193.

46.) A Charge-Transfer-Device Logic Cell, by T. D. Mok and C. A. Salama, Solid State Electronics 1974, Vol. 17, pages 1147–1154.

47.) Charge Coupled Semiconductor Devices, by W. S. Boyle and G. E. Smith, Bell Sys. Tech. J., Vol. 49, pages 587–593, April 1970.

48.) A Simple Charge Regenerator for Use With Charge-Transfer Devices and the Design of Functional Logic Arrays, by Michael F. Tompsett, IEEE Journal of Solid-State Circuits, Vol. SC-7, No. 3, June 1972, pages 237–242.

49.) Bucket-Brigade Electronics - New Possibilities for Delay, Time-Axis Conversion, and Scanning, by F. L. J. Sangster and K. Teer, IEEE Journal of Solid-State Circuits, Vol. SC-4, No. 3, June 1969, pages 131–136.

50.) Charge Transfer Devices, by M. F. Tompsett, J. Vac. Sci. Technol., Vol. 9, No. 4, July–August 1972, pages 1166–1181.

51.) Performance Tests of Large CCD's, by Lloyed Robinson, William Brown, Kirk Gilmore, Richard Stover, Mingzhi Wei, and John Geary, SPIE Vol. 1447 Charge Coupled Devices and Solid State Optical Sensors II (1991).

52.) The Role of Energy in VLSI Computation, by Akhilesh Tyagi, Ph.D. thesis, University of Washington, Computer Science, 1988.

53.) CMOS Differential Pass-Transistor Logic Design, by John H. Pasternak, Alex S. Shubat, and C. Andre T. Salama, IEEE Journal of Solid-State Circuits, Vol. SC-22, No. 2, April 1987, pages 216–222.

54.) Two-Dimensional Electron Gas Charge-Coupled Devices (2DEG-CCD's), by Eric R. Fossum, Jong-ln Song, and David V. Rossi, IEEE Transactions on Electron Devices, Vol. 38, No. 5, May 1991, pages 1182–1192.

55.) A Unified Theory for MOS circuit design-switching network logic, by Min-You Wu, Wei Shu, and Shu-Park Chan, Int. J. Electronics, 1985, Vol. 58 No. 1, pages 1-33.
57.) Introduction to VLSI Systems, by Carver Mead and Lynn Conway, Addison-Wesley 1980.
58.) Diamond Thin-Film Recessed Gate Field-Effect Transistors Fabricated by Electron Cyclotron Resonance Plasma Etching, by S. A. Grot, G. Sh. Gildenblat, and A. R. Badzian, IEEE Electron Device Letters, Vol. 13 No. 9, September 1992, pages 462-464.
59.) Low-Power CMOS Digital Design, by Anantha P. Chandrakasan, Samuel Sheng, and Robert W. Brodersen, IEEE Journal of Solid-State Circuits, Vol. 27, No. 4, April 1992, pages 473-484.
60.) Course Notes on Program Inversion, by Jan van de Snepscheut, Caltech, 1992, to appear in Introduction to Computer Science, Spring Verlag, (David Gries's series) (in preparation).
61.) Adiabiatic Switching, Low Energy Computing, and the Physics of Storing and Erasing Information, by Jeffrey G. Koller and William C. Athas, Physics of Computation Workshop, October 2-4, Dallas Texas 1992.

What is claimed is:

1. A method for performing logic operations, said method comprising the steps of
    conditionally transferring an identifiable charge packet from at least one source to at least one destination under the control of at least one condition that has a logical state that changes in the presence and absence of another identifiable charge packet; and
    preserving the identities of all of said charge packets.
2. Charge transfer logic comprising
    at least one source potential well;
    at least one destination potential well;
    at least one condition potential well; and
    switch means coupled between said source potential well and said destination potential well for conditionally transferring a charge packet from said source potential well to said destination potential well in response to a control stimulus received from said condition potential well, said control stimulus having one logical state in the presence of a charge packet in said condition potential well and another logical state in the absence of a charge packet in said condition potential well, each of said charge packets having an individual identity that is preserved.

* * * * *